(12) United States Patent
Meyer et al.

(10) Patent No.: US 10,262,856 B2
(45) Date of Patent: Apr. 16, 2019

(54) SELECTIVE OXIDATION OF TRANSITION METAL NITRIDE LAYERS WITHIN COMPOUND SEMICONDUCTOR DEVICE STRUCTURES

(71) Applicant: The United State of America, as represented by the Secretary of the Navy, Washington, DC (US)

(72) Inventors: David J. Meyer, Fairfax, VA (US); Brian P. Downey, Alexandria, VA (US); Daniel S. Green, McLean, VA (US)

(73) Assignee: The United States of America, as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 15/843,041

(22) Filed: Dec. 15, 2017

(65) Prior Publication Data
US 2018/0174833 A1   Jun. 21, 2018

Related U.S. Application Data

(60) Provisional application No. 62/435,105, filed on Dec. 16, 2016.

(51) Int. Cl.
 *H01L 21/02* (2006.01)

(52) U.S. Cl.
 CPC .... *H01L 21/02458* (2013.01); *H01L 21/0223* (2013.01); *H01L 21/02447* (2013.01);
 (Continued)

(58) Field of Classification Search
 CPC ... C09K 11/616; C09K 11/628; C09K 11/681; C09K 11/745; C09K 11/7719; C09K 11/7721; C09K 11/7723; C09K 11/7733; C09K 11/7772; C09K 11/88; G01T 1/20; G03F 1/22; G03F 1/24; G11C 11/00; G11C 13/00; G11C 13/0007; G11C 2213/72; H01J 29/20; H01L 21/02378; H01L 21/02458; H01L 21/0254; H01L 21/02658; H01L 21/26586; H01L 21/28194; H01L 21/28202; H01L 27/2409; H01L 27/2463; H01L 29/4966; H01L 29/513;
 (Continued)

(56) References Cited

U.S. PATENT DOCUMENTS 6,002,150 A * 12/1999 Gardner ............ H01L 21/28194
                                                        257/310
6,190,508 B1   2/2001 Peng et al.
(Continued)

OTHER PUBLICATIONS

Y. Gao, I. Ben-Yaacov, U. K. Mishra, and E. L. Hu, "Optimization of AlGaN/GaN current aperture vertical electron transistor (CAVET) fabricated by photoelectrochemical wet etching," Journal of Applied Physics 96, 6925 (2004).

(Continued)

*Primary Examiner* — Edward Chin
(74) *Attorney, Agent, or Firm* — US Naval Research Laboratory; Joslyn Barritt

(57) ABSTRACT

Methods for integrating transition metal oxide (TMO) layers into a compound semiconductor device structure via selective oxidation of transition metal nitride (TMN) layers within the structure.

22 Claims, 13 Drawing Sheets

(52) U.S. Cl.
CPC .... *H01L 21/0254* (2013.01); *H01L 21/02378* (2013.01); *H01L 21/02491* (2013.01)

(58) Field of Classification Search
CPC ... H01L 29/517; H01L 29/518; H01L 29/665; H01L 29/6659; H01L 29/66598; H01L 33/0075; H01L 45/08; H01L 45/12; H01L 45/1233; H01L 45/145; H01L 45/146; H01L 45/1608; H01L 45/1616; H01L 45/1641; H01L 21/0223; H01L 21/02447; H01L 21/02491
See application file for complete search history.

(56) References Cited

U.S. PATENT DOCUMENTS

| | | | |
|---|---|---|---|
| 6,238,944 B1 | 5/2001 | Floyd | |
| 6,306,675 B1* | 10/2001 | Tsong | H01L 21/02378 257/E21.127 |
| 6,902,987 B1 | 6/2005 | Tong et al. | |
| 7,612,342 B1* | 11/2009 | Nagarkar | C09K 11/616 250/361 R |
| 8,425,749 B1* | 4/2013 | Ravula | B03C 5/026 181/141 |
| 8,753,924 B2* | 6/2014 | Wainerdi | H01L 24/29 257/675 |
| 2002/0056906 A1* | 5/2002 | Kajiwara | H01L 24/11 257/697 |
| 2003/0017712 A1* | 1/2003 | Brendel | H01L 21/76259 438/758 |
| 2007/0261016 A1* | 11/2007 | Sandhu | B82Y 10/00 716/50 |
| 2008/0318139 A1* | 12/2008 | Dersch | B82Y 10/00 430/5 |
| 2009/0035665 A1* | 2/2009 | Tran | H01L 21/0337 430/5 |
| 2009/0286382 A1* | 11/2009 | Huff | C23F 4/00 438/455 |
| 2010/0003771 A1* | 1/2010 | Nagai | H01L 21/67092 438/15 |
| 2010/0195269 A1 | 8/2010 | Kim et al. | |
| 2011/0293830 A1 | 12/2011 | Hatanpaa et al. | |
| 2013/0026438 A1* | 1/2013 | Wang | H01L 45/1233 257/4 |
| 2014/0264232 A1 | 9/2014 | Lee et al. | |
| 2015/0348945 A1* | 12/2015 | Or-Bach | H01L 21/743 257/384 |
| 2016/0035851 A1 | 2/2016 | Meyer et al. | |
| 2016/0304340 A1 | 10/2016 | Meyer et al. | |
| 2018/0108554 A1* | 4/2018 | Xiao | H01L 21/68 |

OTHER PUBLICATIONS

K. D. Choquette, K. M. Geib, C. I. H. Ashby, R. D. Twesten, O. Blum, H. Q. Hou, D. M. Follstaedt, B. E. Hammons, D. Mathes, and R. Hull, "Advances in selective wet oxidation of AlGaAs alloys," IEEE Journal of Selected Topics in Quantum Electronics 3, 916 (1997).

M. DeVittorio, P. O. Vaccaro, M. DeGiorgi, S. DeRinaldis, and R. Cingolani, "Local degradation of selectively oxidized AlGaAs/AlAs distributed Bragg reflectors in lateral-injection vertical-cavity surface-emitting lasers," Applied Physics Letters 77, 3905 (2000).

S. D. Wolter, J.M. DeLucca, S.E. Mohney, R.S. Kern, and C.P. Kuo, "An investigation into the early stages of oxide growth on gallium nitride," Thin Solid Films 371, 153 (2000).

S. D. Wolter, S. E. Mohney, H. Venugopala, A. E. Wickenden, and D. D. Koleske, "Kinetic study of the oxidation of gallium nitride in dry air," Journal of the Electrochemical Society 145, 629 (1998).

J. Dorsaz, H. -J. Buhlmann, J. -F. Carlin, N. Grandjean, and M. Ilegems, "Selective oxidation of AlInN layers for current confinement in III Nitride devices," Applied Physics Letters 87, 072102 (2005).

C. F. Lin, W. -C. Lee, B. -C. Shieh, D. Chen, D. Wang, and J. Han, "Fabrication of current confinement aperture structure by transforming a conductive GaN:Si epitaxial layer into an insulating GaOx layer," ACS Applied Materials and Interfaces 6, 22235 (2014).

B. E. Deal and A. S. Grove, "General relationship for the thermal oxidation of silicon," Journal of Applied Physics 36 (12), 3770-3778 (1965).

G. Pourtois, S. Clima, K. Sankaran, P. Delugas, V. Fiorentini, W. Magnus, B. Sorée, S. Van Elshocht, C. Adelman, J. Van Houdt, D. Wouters, S. De Gendt, M.M. Heyns, and J.A. Kittl, "Modeling of alternative high-k dielectrics for memory based applications," ECS Transactions 25 (6), 131-145 (2009).

S.C. Hamm, L. Currano, and S. Gangopadhyay, "Multilayer thin film capacitors by selective etching of Pt and Ru electrodes," Microelectronics Engineering 133, 92-97 (2015).

D. S. Green, C. L. Dohrman, J. Demmin, Y. Zheng, and T. H. Chang, "A Revolution on the Horizon from DARPA: Heterogeneous Integration for Revolutionary Microwave/Millimeter-Wave Circuits at DARPA: Progress and Future Directions," IEEE Microwave Magazine, vol. 18, No. 2, pp. 44-59 (2017).

Search Report and Written Opinion dated May 10, 2018 in corresponding International Application No. PCT/US2017/066581.

* cited by examiner

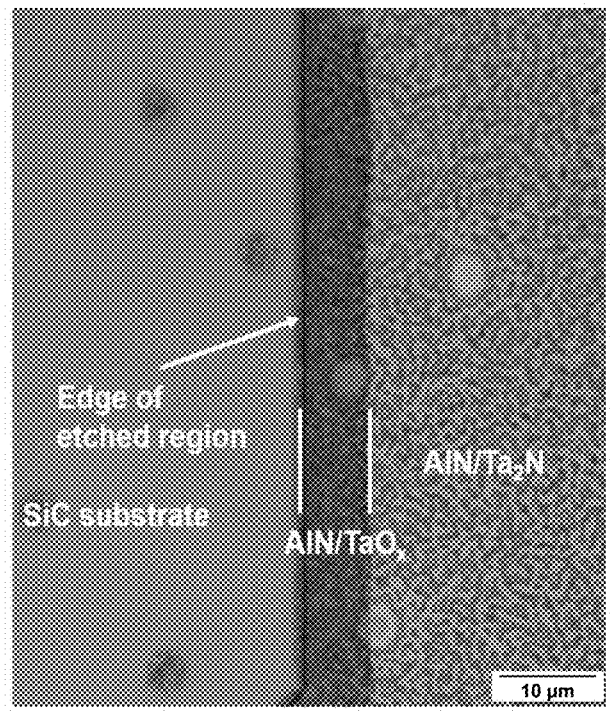
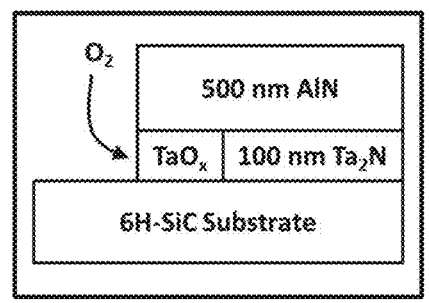
FIG. 4A
FIG. 4B

SELECTIVE OXIDATION OF TRANSITION METAL NITRIDE LAYERS WITHIN COMPOUND SEMICONDUCTOR DEVICE STRUCTURES

CROSS-REFERENCE

This Application is a Nonprovisional of, and claims the benefit of priority under 35 U.S.C. § 119 based on, U.S. Provisional Patent Application No. 62/435,105 filed on Dec. 16, 2016. The Provisional Application and all references cited herein are hereby incorporated by reference into the present disclosure in their entirety.

TECHNICAL FIELD

The present invention relates to compound semiconductor devices, particularly to a method for integrating oxidized transition metal nitride (TMN) layers within a compound semiconductor device structure via selective oxidation.

BACKGROUND

The application of high-quality electrically-insulating layers is required for numerous electronic and optoelectronic semiconductor-based devices. The formation of these insulating layers, typically oxide states of elements or compounds, can be accomplished by various means including deposition techniques such as physical vapor deposition, chemical vapor deposition, atomic layer deposition, sputtering, electron beam or thermal evaporation, etc. or by oxidizing materials that have already been deposited or grown by the aforementioned methods.

In many semiconductor-based devices it is advantageous for the insulating layer to reside between single crystal semiconductor layers, such as in vertical-cavity surface-emitting lasers (VCSELs), see U.S. Pat. No. 6,238,944 to P. D. Floyd, entitled "Buried heterostructure vertical-cavity surface-emitting laser diodes using impurity induced layer disordering (IILD) via a buried impurity source;" and current aperture vertical electron transistors (CAVETs), see Y. Gao, I. Ben-Yaacov, U. K. Mishra, and E. L. Hu, "Optimization of AlGaN/GaN current aperture vertical electron transistor (CAVET) fabricated by photoelectrochemical wet etching," *Journal of Applied Physics* 96, 6925 (2004), among others.

In the particular cases of VCSELs and CAVETs, the operation of the semiconductor-based device requires that the buried insulating layer not be laterally continuous, and that the non-insulating part of the layer be electrically conductive. This type of semiconductor device structure typically requires a material that can be grown epitaxially within the structure, that can be laterally oxidized in a manner that will not significantly oxidize other materials within the same device structure (known as "selective oxidation"), and will not react with neighboring materials during the selective oxidation step.

In the III-As material system, this nature of lateral oxidation of an epitaxial buried semiconductor layer is accomplished via an $Al_xGa_{1-x}As$ layer with high aluminum mole fraction x, see K. D. Choquette, K. M. Geib, C. I. H. Ashby, R. D. Twesten, O. Blum, H. Q. Hou, D. M. Follstaedt, B. E. Hammons, D. Mathes, and R. Hull, "Advances in selective wet oxidation of AlGaAs alloys," *IEEE Journal of Selected Topics in Quantum Electronics* 3, 916 (1997), and has been widely exploited for the fabrication of III-As-based VCSELs. See U.S. Pat. No. 6,238,944, supra; see also M. DeVittorio, P. O. Vaccaro, M. DeGiorgi, S. DeRinaldis, and R. Cingolani, "Local degradation of selectively oxidized AlGaAs/AlAs distributed Bragg reflectors in lateral-injection vertical-cavity surface-emitting lasers," *Applied Physics Letters* 77, 3905 (2000). In addition to buried insulator layers, insulating layers at the surface of a semiconductor device structure are typical, for instance as a gate dielectric or surface passivation layer in a transistor structure.

In Si-based transistors, a high quality insulator can be formed by oxidizing the surface of the Si; however, in many other semiconductor material systems, particularly compound semiconductors, direct oxidation of the semiconductor does not provide an oxide layer with adequate electrical properties.

Alternatively, in the case of an insulating layer at the surface, it may be advantageous to deposit an insulating material on the semiconductor device surface immediately after growing the semiconductor device layers to limit the amount of contamination and the formation of defects at the semiconductor/insulator interface. Materials compatibility issues may preclude the deposition of various semiconductors, insulators, and metals within the same growth chamber, and therefore, the in situ deposition of an insulator on the semiconductor may not be possible. In this case, a material must be deposited that is compatible with the semiconductor growth technique and can be selectively oxidized without reacting with the neighboring semiconductor material.

While the oxidation of Si for gate oxides in transistors and the lateral oxidation of buried $Al_xGa_{1-x}As$ layers for VCSELs is well established, the application of these techniques is more challenging for III-N (i.e., GaN, AlN, InN, and alloys thereof) and SiC wide bandgap semiconductors. These semiconductors are used in a variety of electronic and optoelectronic applications including high power electronics, high frequency transistors, light-emitting diodes, and lasers.

The ability to incorporate high quality insulating layers within these semiconductors and/or at the semiconductor device surface would increase current device performance and open up new avenues of device design. In the case of the III-Ns, direct oxidation of GaN requires a high temperature, typically greater than 800° C., and has an oxidation rate of only a few nanometers of oxide growth after 5 hours at 800° C. in a dry $O_2$ environment, see S. D. Wolter, J. M. DeLucca, S. E. Mohney, R. S. Kern, and C. P. Kuo, "An investigation into the early stages of oxide growth on gallium nitride," *Thin Solid Films* 371, 153 (2000) ("Wolter 2000"), and an oxidation rate of approximately 20 nm/hr at 900° C. in a dry air environment. See S. D. Wolter, S. E. Mohney, H. Venugopala, A. E. Wickenden, and D. D. Koleske, "Kinetic study of the oxidation of gallium nitride in dry air," *Journal of the Electrochemical Society* 145, 629 (1998) ("Wolter 1998"). These oxidation conditions are not selective to other III-N materials or metals and the oxidation rate is insufficient for practical applications of lateral oxidation.

An alternative method of oxidizing GaN is via photo-enhanced wet oxidation, where ultraviolet (UV) light is used to induce the oxidation process in an aqueous phosphoric acid solution. See U.S. Pat. No. 6,190,508, to L.-H. Peng, Y.-C. Hsu, C.-Y. Chen, J.-K. Ho, and C.-N. Huang, entitled "Method of oxidizing nitride material enhanced by illumination with UV light at room temperature." This process has many inherent disadvantages including additional processing steps such as depositing a metal electrode on the sample to act as a cathode, which must be etched away after the oxidation step. Additionally, since this process requires the GaN layer to be exposed to UV light, the GaN layer cannot be buried under a material with a smaller bandgap, which would absorb the UV light before it can reach the GaN layer, limiting device design.

Furthermore, the acidic environment required for the oxidation process may not be compatible with all desired materials.

A reported method for the selective lateral oxidation of III-N materials is through the anodic oxidation of a buried $In_{0.18}Al_{0.82}N$ layer, which is lattice-matched to GaN, see J. Dorsaz, H.-J. Buhlmann, J.-F. Carlin, N. Grandjean, and M. Ilegems, "Selective oxidation of AlInN layers for current confinement in III-Nitride devices," *Applied Physics Letters* 87, 072102 (2005), in a nitrilotriacetic acid solution. While the $In_{0.18}Al_{0.82}N$ layer has been shown to be selectively laterally oxidized for many micrometers over GaN and InGaN layers, the process requires a metal electrode to be deposited on the sample, which creates additional processing steps. Moreover, the $In_{0.18}Al_{0.82}N$ has a high electrical resistivity, which is not desirable for many applications.

An alternative method is the lateral oxidation of buried conductive n-type GaN layers in a III-N device structure consisting of p-type GaN, unintentionally-doped GaN, and InGaN. See C.-F. Lin, W.-C. Lee, B.-C. Shieh, D. Chen, D. Wang, and J. Han, "Fabrication of current confinement aperture structure by transforming a conductive GaN:Si epitaxial layer into an insulating $GaO_x$ layer," *ACS Applied Materials and Interfaces* 6, 22235 (2014). This method first requires a wet electrochemical etching step in oxalic acid solution to modify the n-type GaN layer into a nanoporous GaN structure. This is followed by the oxidation of the newly formed nanoporous GaN layer via photoelectrochemical oxidation in deionized water. Similar to the previously discussed methods, this process requires further processing steps, such as the deposition of a metal electrode on the sample for the wet etching and oxidation steps, material incompatibility issues with the wet etch environment, and limitation in device design as any other n-type GaN layer in the structure would also be etched and oxidized as well.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides methods for integrating oxidized transition metal nitride (TMN) layers within such a compound semiconductor device structure via selective oxidation for the purposes of adding enhanced electrical performance and/or previously unavailable functionality.

The structures and methods for preparing a semiconductor device structure in accordance with the present invention include providing an electrically conductive transition metal nitride (TMN) layer used as an epitaxial metal layer in combination with a SiC substrate and III-N semiconductor materials. In accordance with the present invention, the TMN layers can then be selectively thermally oxidized at temperatures below where any significant oxidation of the semiconductor materials occurs to create fully or partially oxidized electrically insulating buried or surface layers.

In an exemplary embodiment, a patterned etch mask is deposited on an uppermost semiconductor layer of a sample that includes a substrate, an epitaxial TMN layer formed thereon and one or more semiconductor layer(s) formed on the TMN layer. An etchant is then used to define the device structure edges where lateral oxidation of the epitaxial TMN layer will start and then the etch mask is removed. Etching can be accomplished by means of any suitable process such as dry plasma or wet etching. In some embodiments, etching can proceed through the entire TMN layer, while in other embodiments, etching can proceed just enough to expose the TMN layer.

After etching and removal of the etch mask, the etched epitaxial TMN layer can be oxidized from the edges defined by the etching step, most simply by placing the sample in an oxygen containing environment such as pure $O_2$ at elevated temperatures. The $O_2$ will react with the epitaxial TMN layer, creating transition metal oxide (TMO) regions in the TMN material. The lateral oxidation reaction will continue until a desired spatial profile of oxidized material is obtained. When that occurs, the sample is removed from the oxidizing environment or the temperature is reduced to below a critical temperature for significant oxide growth.

In some cases, the epitaxial TMN layer can be fully oxidized along the entire length of the device such that all of the epitaxial TMN layer becomes a TMO layer. In other cases, the oxidation reaction may be stopped before the epitaxial TMN layer is fully oxidized, such that sections of electrically insulating TMO material are produced nearest the areas where the $O_2$ has contacted the TMN material, with sections of electrically conductive unoxidized TMN remaining elsewhere on the TMN layer.

By selectively etching the epitaxial TMN layer to define areas to be exposed to the $O_2$ and then by controlling the exposure time of those defined areas to the $O_2$, a controlled, selected spatial profile of the TMO material can be obtained.

BRIEF DESCRIPTION OF THE DRAWINGS

FIGS. 4A and 4B illustrate aspects of lateral oxidation of buried $Ta_2N$ layer in accordance with the present disclosure.

FIGS. 8A and 8B are plots comparing an exemplary $NbN_x/Al_{0.38}Ga_{0.62}N$/GaN structure before and after selective thermal oxidation of the TMN layer, in which FIG. 8A is a current-voltage plot and FIG. 8B is a capacitance-voltage plot of such a structure.

DETAILED DESCRIPTION

Figure 1:
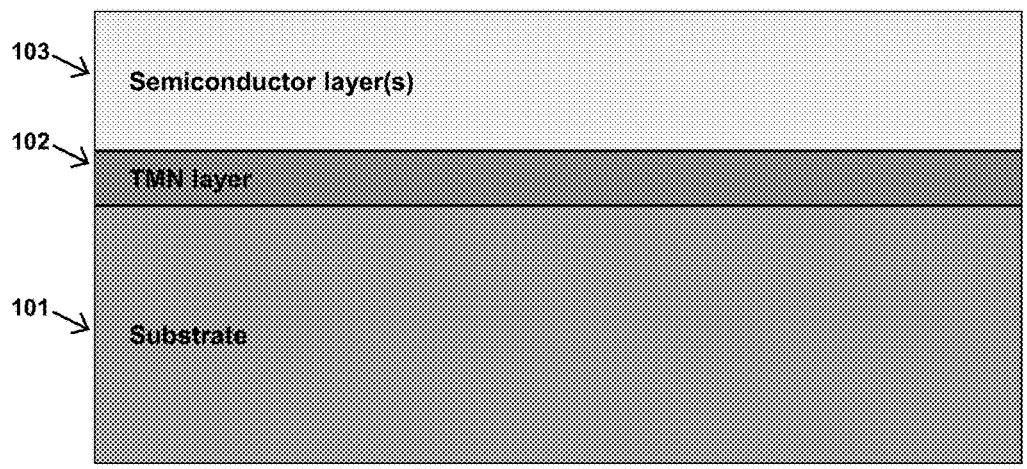
FIG. 1 is a cross-sectional block schematic of a substrate having a TMN metallic layer buried beneath one or more semiconductor layer(s).

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

Transition metal nitride (TMN) materials such as tantalum nitride ($TaN_x$), niobium nitride ($NbN_x$), tungsten nitride ($WN_x$), and molybdenum nitride ($MoN_x$) have a crystal structure similar to many relevant semiconductors of interest such as silicon carbide (SiC) and the Group III-Nitrides (III-Ns) such as gallium nitride (GaN), aluminum nitride (AlN), indium nitride (InN), and their various alloys and so can be an important addition to a semiconductor device. Alloys of TMNs with the III-N materials GaN, AlN, and InN, e.g., the alloys $Ti_xInN$, $Nb_xInN$, $Ta_xInN$, and $Hf_xAlN$, may provide a better lattice match with GaN and AlN and so may be of particular interest in some cases. Similarly, layers of TMN materials in combination with III-V layers may realize different oxide stoichiometries through the oxidation process or a combination of oxidation and annealing.

In addition, TMN materials have excellent thermal stability and can be deposited in situ with other semiconductor materials, and as a result, the TMN layers can be buried within the epitaxial semiconductor device structure. See U.S. Patent Application Publication No. 2016/0035851, "Epitaxial metallic transition metal nitride layers for compound semiconductor devices," by D. J. Meyer, B. P. Downey, and D. S. Katzer, which shares several inventors in common with the present invention.

The present invention provides methods for integrating oxidized transition metal nitride (TMN) layers within such a compound semiconductor device structure via selective oxidation for the purposes of adding enhanced electrical performance and/or previously unavailable functionality.

In the discussion below, like numbers are used to refer to like elements in the FIGURES, with the first digit of the reference numbers being changed to reflect the FIGURE in which they are shown. For example, the TMN layer in the structures described herein is referred to as TMN layer 102 in the discussion of FIG. 1, TMN layer 302 in the discussion of FIG. 3, TMN layer 602 in the discussion of FIG. 6, etc.

The structures and methods in accordance with the present invention include providing an electrically conductive TMN layer used as a metal layer in combination with a SiC substrate and III-N semiconductor materials in a semiconductor device structure. In some embodiments, the TMN layer can be "buried in" i.e., situated within the semiconductor device structure; in such cases, the TMN layer should be an epitaxial layer. In other embodiments, the TMN layer can be situated on an upper surface of the semiconductor device structure; in such cases, although the TMN layer need not be an epitaxial layer, it is important that the TMN layer have good thermal stability with the surface layer below so the that the TMN and surface layer do not react during oxidation. In either case, in accordance with the present invention, the TMN layers can then be selectively thermally oxidized at temperatures below where any significant oxidation of the semiconductor materials occurs to create fully or partially oxidized electrically insulating buried or surface TMN layers.

It will be noted here that although the structures and methods in accordance with the present invention are often described in the present disclosure in the context of specific materials, e.g., tantalum nitride ($Ta_2N$) and niobium nitride ($Nb_2N$) TMN materials and/or aluminum nitride (AlN) semiconductor materials, such specific materials are merely exemplary, and the description thereof should not in any way be taken as limiting of the scope of the present disclosure or the claims presented herein.

Both $Ta_2N$ and $Nb_2N$ possess the necessary properties for a stable epitaxial relationship with SiC and the III-N semiconductors and so are suitable materials for the TMN layer. See U.S. Patent Application Publication No. 2016/0035851, supra. Both $Ta_2N$ and $Nb_2N$, as well as the commonly-used 4H or 6H polytypes of SiC, all have a hexagonal crystal structure, and their in-plane lattice constants a are similar, with $a_{SiC}$=3.073 Å, $a_{Ta2N}$=3.041 Å, and $a_{Nb2N}$=3.05 Å. The III-N semiconductors GaN and AlN also have crystal structures and in-plane lattice constants similar to those of $Ta_2N$ and $Nb_2N$, where the crystal structure of GaN and AlN is wurtzite with lattice constants $a_{GaN}$=3.189 Å and $a_{AlN}$=3.112 Å. All of these materials are commonly grown on 4H— or 6H—SiC substrates due to their similar crystal structures and in-plane lattice constants. Additionally, the cubic phase of some TMN materials, such as cubic NbN, have a similar interatomic spacing on the crystallographic (111) plane compared to the in-plane lattice constant a of the hexagonal materials listed above (SiC, AlN, GaN, etc.), and would also be suitable for many implementations of this invention.

Based on the heat of formation and the high melting points of $Ta_2N$ and $Nb_2N$ (>2500° C.), these materials are expected to maintain thermodynamic stability with SiC, AlN, or GaN at typical growth temperatures for most commonly-used epitaxial growth methods, such as molecular beam epitaxy (MBE), metal organic vapor phase epitaxy (MOVPE), atomic layer epitaxy (ALE), sputtering, etc., which can be achieved at temperatures below 1300° C. This high thermal stability between the TMN and semiconductors is also required for thermal oxidation of the TMN layer after the entire device structure is grown. This growth technique has been experimentally demonstrated using MBE growth of $Ta_2N$ and various III-N semiconducting layers grown on a 6H—SiC substrate.

FIG. 1 shows an exemplary structure in accordance with the present invention, in which an epitaxial TMN layer 102 is situated between, i.e., "buried between," a substrate 101 and one or more semiconductor layers 103. For example, an epitaxial $Ta_2N$ layer 102 may be grown by molecular beam epitaxy (MBE) on a 6H—SiC substrate 101 to a desired thickness; in such embodiments, an AlN layer 103 can be grown in situ in the same MBE chamber directly after the $Ta_2N$ layer 102 growth is terminated. In other embodiments in which the TMN layer (e.g., $Ta_2N$ layer 102 as referenced above) is grown using alternative growth techniques such as sputtering, metalorganic vapor phase epitaxy (MOVPE), or atomic layer epitaxy (ALE), AlN layer 103 can be grown ex situ after formation of $Ta_2N$ layer 102.

There are many optional processing steps that can be used after the device structure is grown. For example, devices may be further processed using common semiconductor device processing techniques such as photolithography, metallization, etching, annealing, ion implantation, etc. Due to the high melting point and thermodynamic stability of the TMN layer, a large thermal budget is available for subsequent processing steps. The oxidation of the TMN layer must occur before other materials that oxidize under similar conditions are integrated into the semiconductor device structure, such as some metals.

In an experimental embodiment of such a structure analyzed by the inventors of the present invention, a single phase hexagonal $Ta_2N$ film 102 having a thickness of 100 nm was grown on the Si-face of a 6H—SiC substrate 101, followed by a 200 nm AlN layer 103. The sheet resistance of this 100 nm $Ta_2N$ layer was measured to be 11 $\Omega$/sq.

Figure 2:
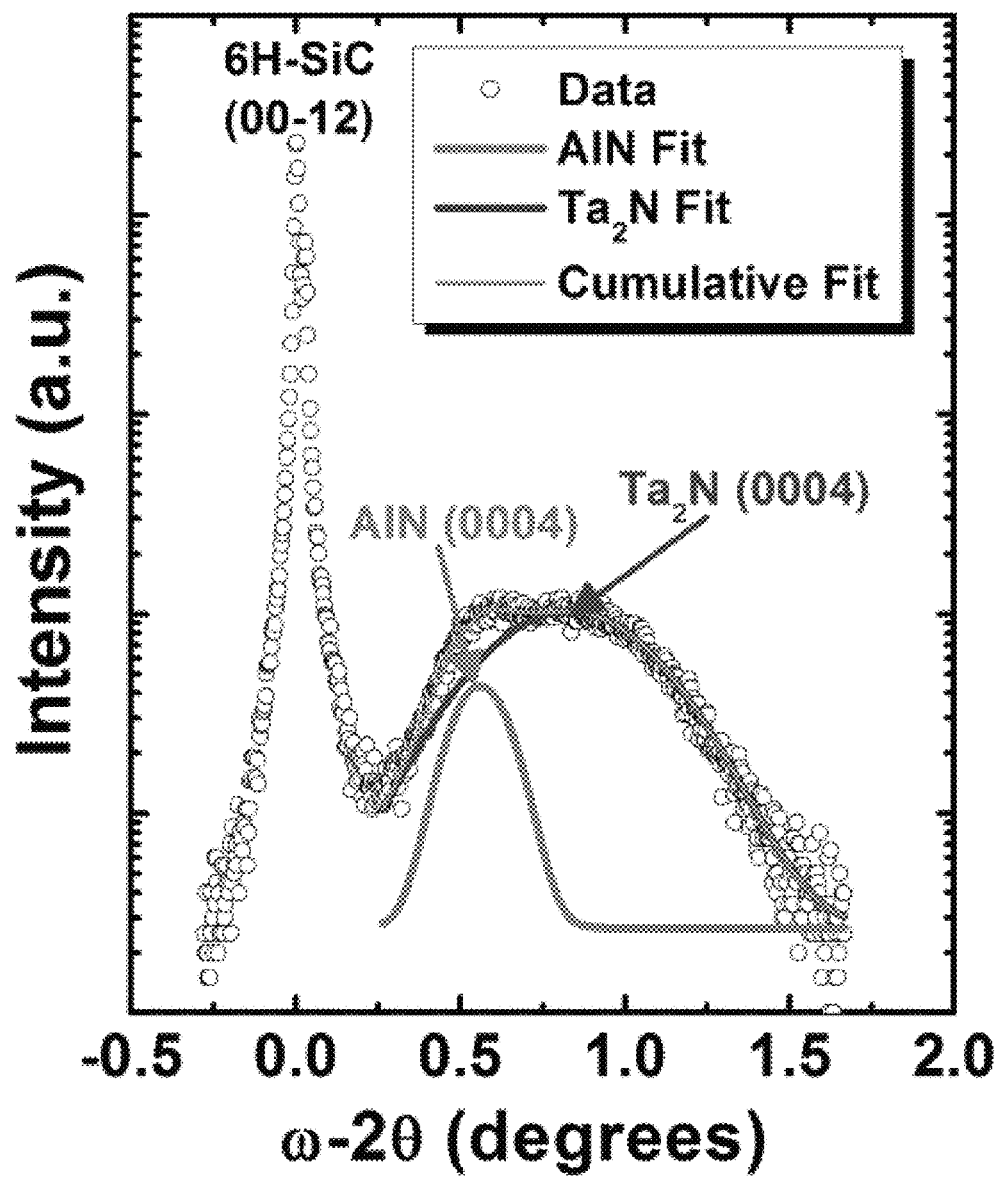
FIG. 2 contains an XRD data plot showing single phases of 200 nm AlN/100 nm $Ta_2N$ film stack grown on a 6H—SiC substrate.

FIG. 2 contains X-ray diffraction (XRD) plots showing single phases of such a 200 nm AlN/100 nm $Ta_2N$ film stack grown on a 6H—SiC substrate. Via identification of the peaks in the XRD data, the $Ta_2N$ and AlN layers are shown to be epitaxial and single phase, while the small full-width at half-maximum of the (0004) AlN and $Ta_2N$ peaks, 0.2° and 0.6°, respectively, demonstrate the high crystalline quality of the films achieved on the substrate.

In accordance with the present invention, the epitaxial TMN layers in such a structure can then be selectively oxidized using the process steps described below.

FIGS. 3A-3D are cross-sectional schematics illustrating aspects of a first exemplary embodiment of a process for achieving controllable, selective oxidation of the epitaxial TMN layers within a compound semiconductor device structure.

Figure 3A:
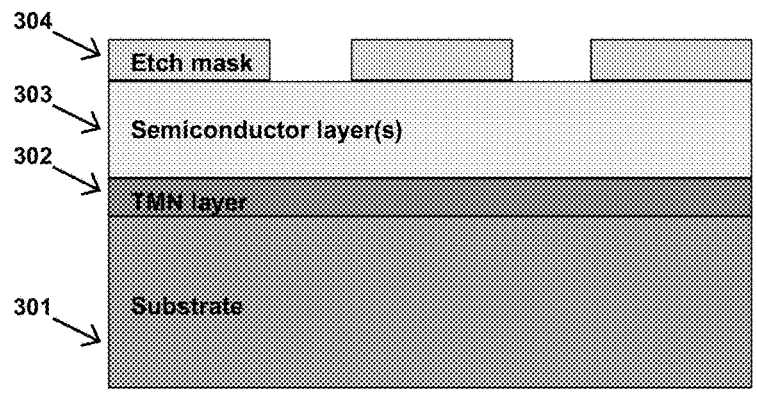
FIGS. 3A-3D are cross-sectional block schematics showing aspects of an exemplary method for fabricating a device having an oxidized TMN material in accordance with one or more aspects of the present disclosure.

The process according to the embodiment illustrated in FIGS. 3A-3D begins with the formation of a sample such as that shown in FIG. 3A, which includes a substrate 301 with an epitaxial TMN layer 302 formed thereon and one or more semiconductor layer(s) 303 formed on the TMN layer such that TMN layer 302 is "buried" within the structure. The semiconductor layers 303 will typically be formed from a single crystal Group III-Nitride material or single crystal SiC, but can also be in the form of a heterostructure formed from such single crystal Group III-Nitride materials and/or SiC. A patterned etch mask 304 can then be deposited on an upper surface of the uppermost semiconductor layer 303 to define the outlines of the device structure where the lateral oxidation of the epitaxial TMN layer 302 will occur. The etch mask can be formed from any suitable process-compatible material such as a polymer, a metal, an insulator, or a semiconductor and is typically patterned via photolithography.

Figure 3B:
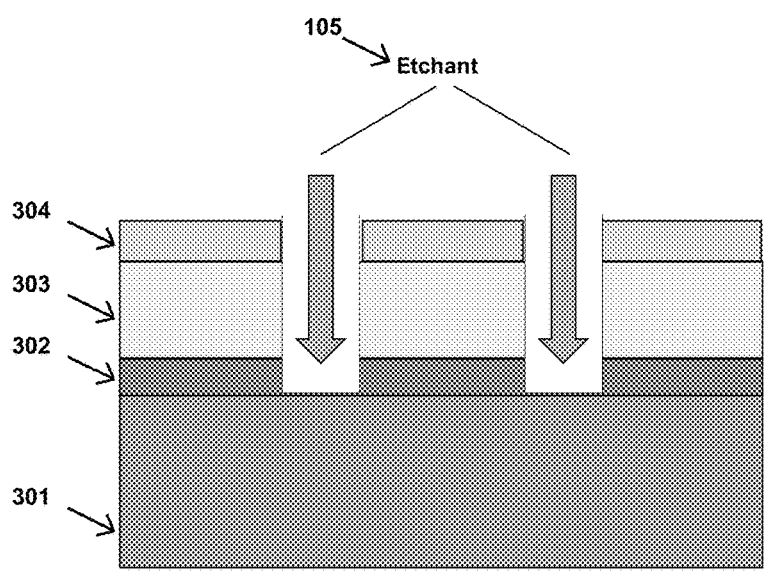

In a next step, shown in FIG. 3B, an etchant 305 is used to define the device structure edges where lateral oxidation of the epitaxial TMN layer 302 will start. Etching should proceed through the entire TMN layer and can be accomplished by means of any suitable process such as dry plasma or wet etching. In many cases dry etching is preferred due to the anisotropic nature of the etch process, but other etch chemistries may also be employed, depending on the material used for the semiconductor layer(s) 303 and the TMN layer 302. For example, both $Ta_2N$ and $Nb_2N$ can be etched using fluorine and chlorine-containing plasma chemistries, but other suitable etchants may be used for other TMN materials.

Figure 3C:
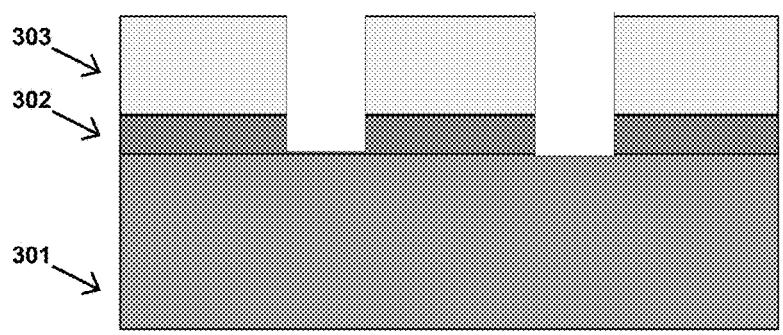

After etching, as shown in FIG. 3C, etch mask 304 can be removed from the semiconductor layer(s) using any suitable wet or dry etch process.

Figure 3D:
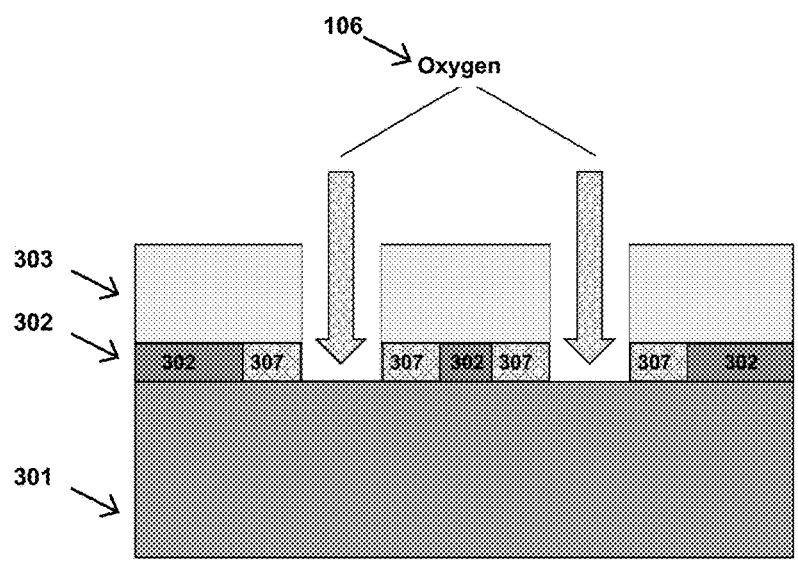

Finally, as shown in FIG. 3D, epitaxial TMN layer 302 can be oxidized from the edges defined by the etch step. While epitaxial TMN layer 302 can be oxidized by a variety of methods, oxidation can be performed most simply by placing the sample in an oxygen containing environment such as pure $O_2$ 106 at suitable temperatures. Both $Ta_2N$ and $Nb_2N$ TMNs have been shown experimentally to oxidize at controllable rates in $O_2$ environments at temperatures between 550 and 800° C., allowing the oxidization of the TMN material at temperatures below those at which significant oxidation of SiC or III-N materials occurs.

During this step, the $O_2$ 106 reacts with the TMN material in epitaxial TMN layer 302, creating transition metal oxide (TMO) regions 307 in TMN layer 302. As part of this reaction, the $O_2$ 106 also creates nitrogen-containing gas reaction products which are not incorporated into the TMO material but instead laterally diffuse out of the TMO regions 307 into the oxidation atmosphere. The lateral oxidation reaction will continue until the desired lateral degree of oxidation of the TMN material is achieved. When that occurs, the sample is removed from the oxidizing environment or the temperature is reduced to below a critical temperature for significant oxide growth. In some cases, epitaxial TMN layer 302 can be fully oxidized along the entire length of the device such that all of epitaxial TMN layer 302 becomes a TMO layer. In other cases, such as is shown in FIG. 3D, the oxidation reaction may be stopped before epitaxial TMN layer 302 is fully oxidized, such that sections of electrically insulating TMO material 307 are produced nearest the areas where the $O_2$ 106 has contacted the TMN material, with sections of electrically conductive unoxidized TMN material remaining elsewhere on TMN layer 302. In accordance with the present invention, by selectively etching epitaxial TMN layer 302 to define areas to be exposed to the $O_2$ 106 and then by controlling the exposure time of those defined areas to the oxygen, a controlled, predetermined spatial profile of the TMO material can be obtained.

While the epitaxial TMN layer 302 can be oxidized from the edges of the wafer in the as-grown structure, as described in more detail below, in many embodiments, an additional etch step will be used to open up access to the buried epitaxial TMN layer 302 from the edge of each individual device.

FIGS. 4A and 4B illustrate aspects of such selective oxidation of a buried TMN layer in accordance with the present invention, where FIG. 4A shows the results of experimental observation of such selective oxidation of an exemplary 100 nm buried epitaxial $Ta_2N$ layer with a 500 nm AlN layer grown on top, illustrated by the cross-sectional schematic in FIG. 4B.

In the exemplary case observed for FIG. 4A, the AlN layer was patterned using conventional optical photolithography, the AlN and $Ta_2N$ layers were etched down to the SiC substrate using a chlorine-based plasma, and the photoresist etch mask was removed using acetone. The sample was then placed in a rapid thermal annealing (RTA) furnace which was pumped to a base pressure of $2\times10^{-4}$ mbar before flowing $O_2$ through the system. The RTA furnace was then heated to 800° C. under an $O_2$ flow rate of 100 sccm with an associated pressure of 0.0130 mbar to provide oxidation of the buried epitaxial $Ta_2N$ layer.

Figure 5:
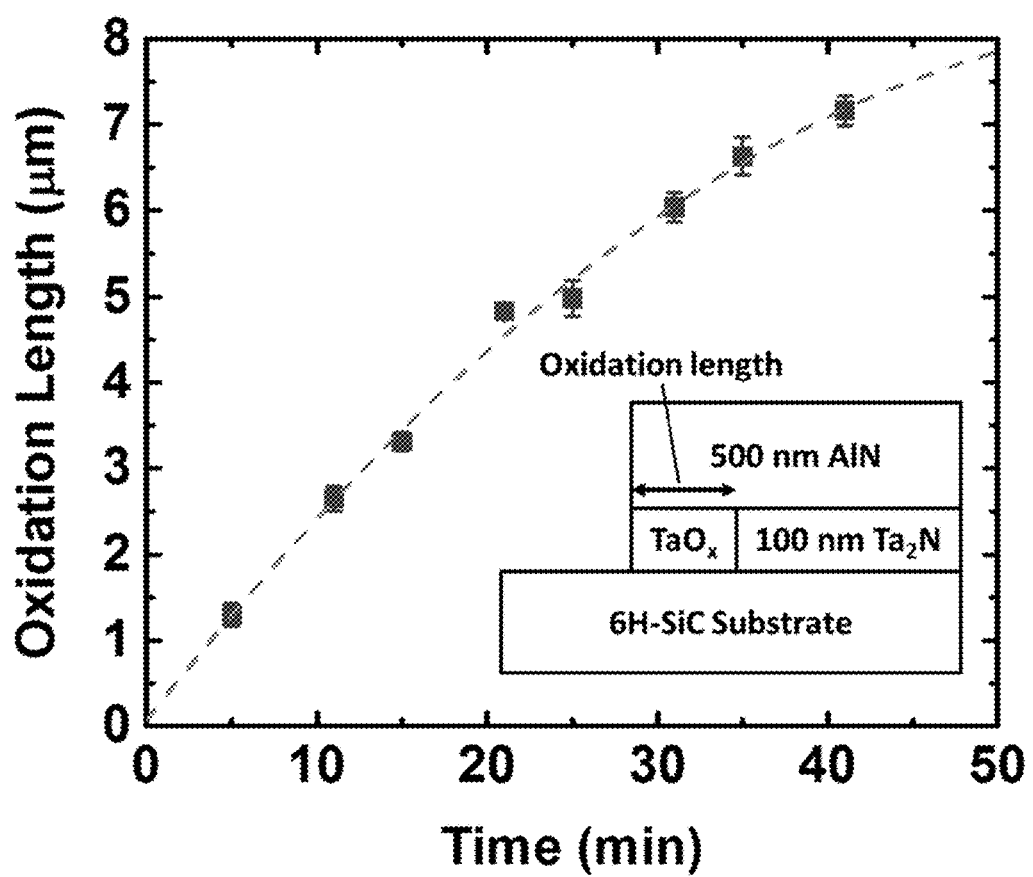
FIG. 5 is a plot showing oxidation length of buried $Ta_2N$ layer at 800° C. in $O_2$ atmosphere for various oxidation times.

The lateral oxidation length of the sample as a function of time is shown by the plot in FIG. 5, where the oxidation follows the Deal-Grove oxidation model described in B. E. Deal and A. S. Grove, "General relationship for the thermal oxidation of silicon," *Journal of Applied Physics* 36 (12), 3770-3778 (1965), and as can be seen from FIG. 4A, can be measured by the change in color of the sample under an optical microscope. No significant oxidation of the AlN layer or SiC substrate was observed, as reflected in the absence of any change of color of those materials shown in FIG. 4A.

Figure 6:
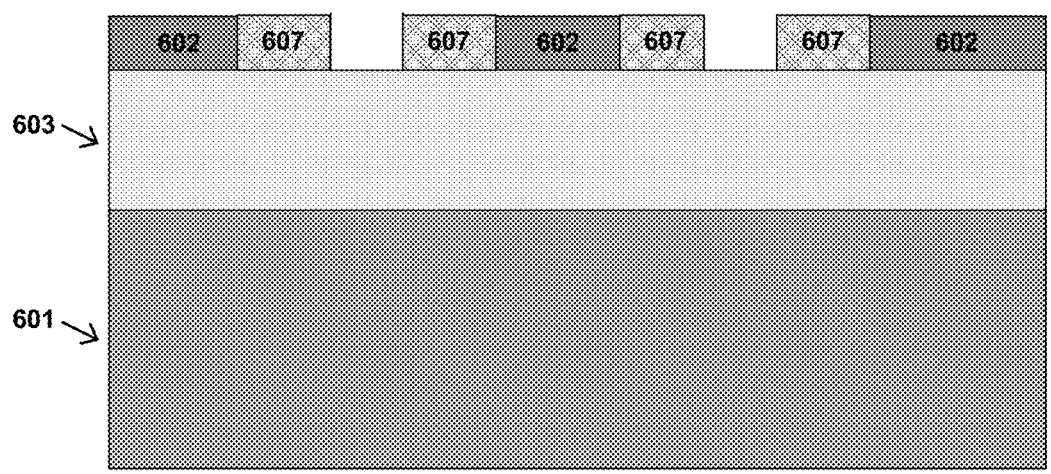
FIG. 6 is a cross-sectional block schematic showing a semiconductor device having a TMN layer at the device surface.

FIG. 6 illustrates an alternative embodiment of a sample structure that can be used in a process for selectively oxidizing a TMN layer in accordance with the present invention.

In the embodiment shown in FIG. 6, TMN layer 602 may be grown in situ on the surface of the semiconductor layer(s) 603 rather than on the surface of the substrate 601, below the semiconductor layers as in the embodiments shown in FIG. 1 and FIGS. 3A-3D discussed above. In the embodiment shown in FIG. 6, the TMN layer would not have to be grown epitaxially on the semiconductor of interest, though it still would have to be thermodynamically stable at the temperature required for selective oxidation. TMN layer 602 can be used to create a surface insulating layer, e.g., for use as a gate insulator or surface passivation layer, via selective oxidation using a predetermined oxidation temperature and time as described above with respect to FIGS. 3A-3D, where the area to be oxidized is defined by openings in a mask deposited on the upper surface of the TMN layer and where the oxidization temperature and time are configured to produce a areas of TMO material 607 having a predetermined spatial profile within TMN layer 602. As in the oxidation described above with respect to FIGS. 3A-3D, such TMO material can extend underneath the unpatterned portion of the semiconductor material layer 603 so as to produce areas of electrically insulating TMO material 607 that is "buried" within the semiconductor structure. Forming an area of TMO material 607 in accordance with the present invention would facilitate a contaminant-free low defect oxide/semiconductor interface, which is advantageous for semiconductor devices.

In other embodiments, the TMN layer can be situated on an upper surface of the semiconductor device structure; in such cases, the surface TMN layer will oxidize at lower temperature than does the semiconductor layer below. Although the TMN layer need not be an epitaxial layer, it is important that the TMN layer have good thermal stability with the surface layer below so the that the TMN and surface layer do not react during oxidation.

Figure 7A:
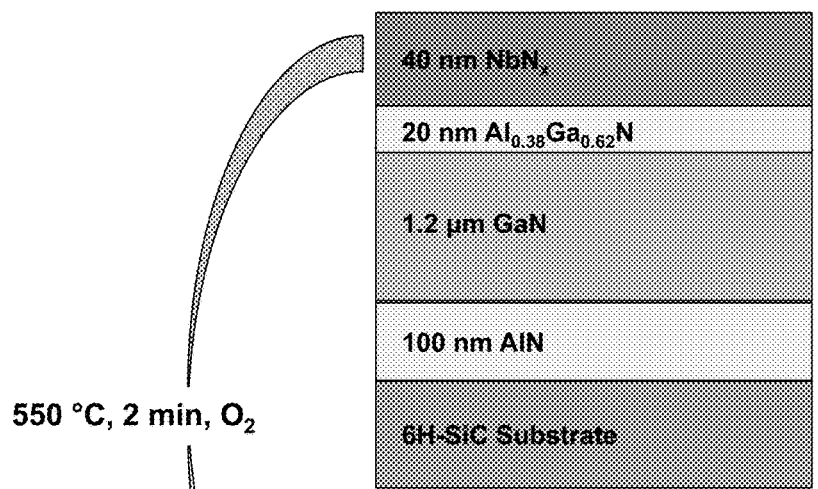
FIGS. 7A and 7B are cross-sectional block schematics showing aspects of an exemplary $Al_{0.38}Ga_{0.62}N$/GaN structure with an in situ $NbN_x$ layer deposited on the surface before and after selective thermal oxidation of the $NbN_x$ layer in accordance with the one or more aspects of the present disclosure.
Figure 7B:
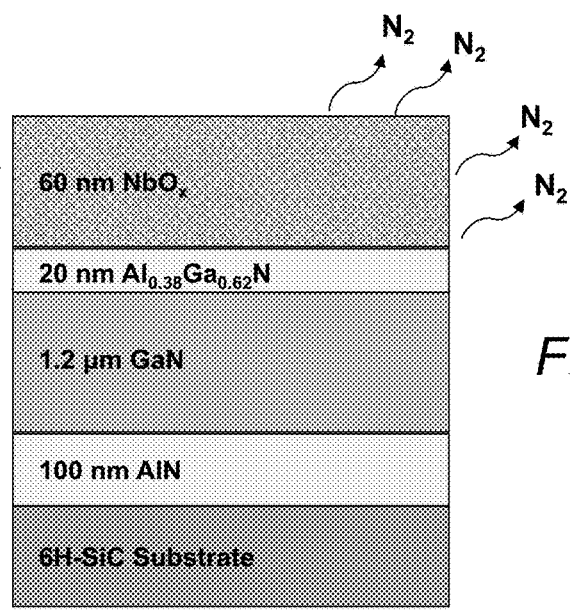

FIGS. 7A and 7B schematically illustrate the selective oxidation of such a TMN layer on top of a semiconductor device structure that has been experimentally verified by the inventors. A semiconductor structure was fabricated via in situ deposition of a 40 nm thick $NbN_x$ layer at 300° C. via MBE on an $Al_{0.38}Ga_{0.62}N$/GaN heterostructure such as that shown in the cross-section block schematic shown in FIG. 7A. The AlGaN/GaN structure is commonly used for high-electron-mobility transistors (HEMTs) due to the creation of a two-dimensional electron gas (2DEG) at the AlGaN/GaN interface. In addition, it is advantageous in some III-N-based HEMT structures to include a gate insulator layer to reduce gate leakage current. In the exemplary structure examined by the inventors, the $Al_{0.38}Ga_{0.62}N$/GaN structure consisted of a 20 nm $Al_{0.38}Ga_{0.62}N$ layer, a 1.2 μm GaN layer, and a 100 nm AN nucleation layer grown on a 6H—SiC substrate. The 40 nm $NbN_x$ layer was grown in the same MBE growth chamber immediately after the semiconductor device growth.

Selective thermal oxidation of $NbN_x$ was performed in an RTA furnace at 550° C. under an $O_2$ flow rate of 100 sccm with an associated pressure of 0.0130 mbar for 120 s, creating a 60 nm $NbO_x$ TMO layer with no observable reaction with any of the semiconductor layers as shown in FIG. 7B, with the nitrogen from the $NbN_x$ simply diffusing off of its surface into the surrounding ambient.

Figure 8A:
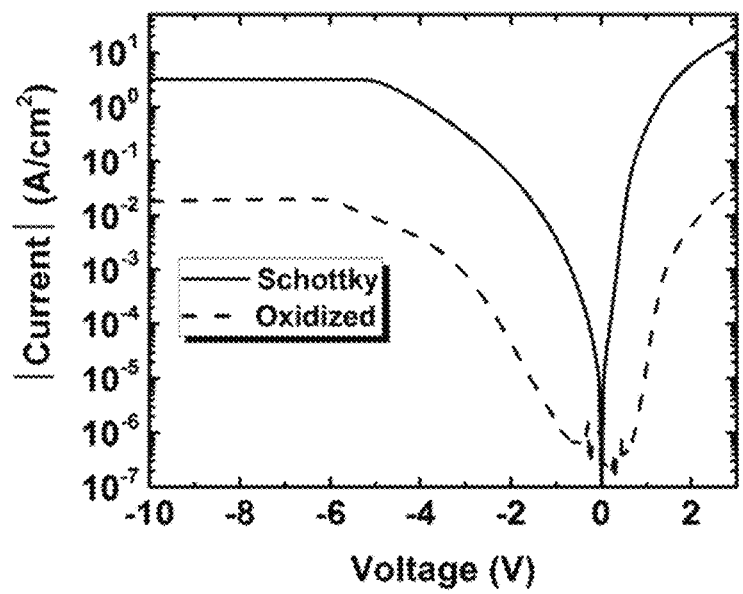
Figure 8B:
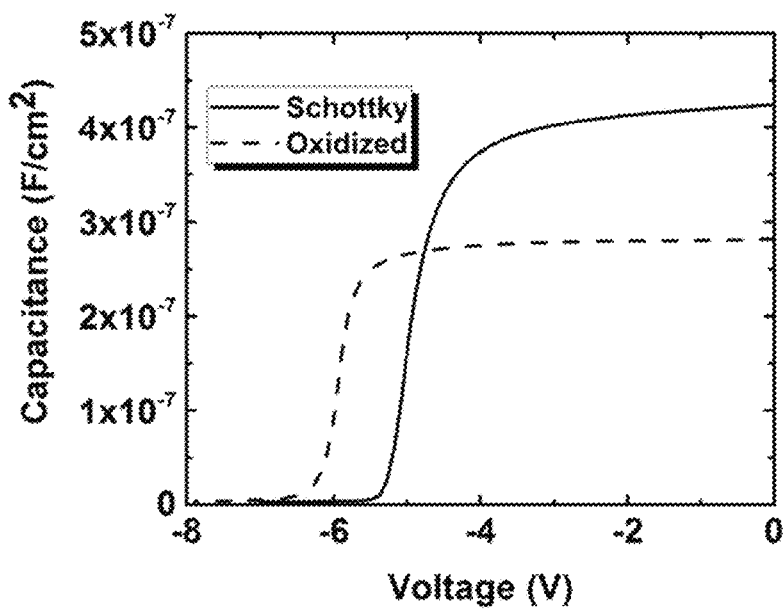

After the formation of the $NbO_x$ layer, Ni/Au contacts were deposited on top for electrical characterization of the $NbO_x/Al_{0.38}Ga_{0.62}N$/GaN structure before and after oxidation of the TMN layer, where in the before case, the $NbN_x$ layer acts as a Schottky contact to the $Al_{0.38}Ga_{0.62}N$/GaN structure. The results of this characterization are shown by the plots in FIGS. 8A and 8B. As shown by the plot in FIG. 8A, current-voltage measurements show a greater than 100× reduction in leakage current in both the forward and reverse bias directions for the $NbO_x/Al_{0.38}Ga_{0.62}N$/GaN structure compared the $Al_{0.38}Ga_{0.62}N$/GaN structure with NbN Schottky contacts. Capacitance-voltage measurements reflected in the plot in FIG. 8B show a reduced capacitance for the $NbO_x/Al_{0.38}Ga_{0.62}N$/GaN structure, consistent with the addition of the insulating $NbO_x$ layer in series with the $Al_{0.38}Ga_{0.62}N$ layer. A high dielectric constant of 60 is extracted from the difference between the two curves in FIG. 8B, which is the same as the reported value of the dielectric constant of $Nb_2O_5$. See G. Pourtois, S. Clima, K. Sankaran, P. Delugas, V. Fiorentini, W. Magnus, B. Sorée, S. Van Elshocht, C. Adelman, J. Van Houdt, D. Wouters, S. De Gendt, M. M. Heyns, and J. A. Kittl, "Modeling of alternative high-k dielectrics for memory based applications," *ECS Transactions* 25 (6), 131-145 (2009).

There are a number of additional possible implementations of a device structure formed in accordance with the present invention. For example, while $Ta_2N$ and $Nb_2N$ have been mentioned in the best mode of the invention, various metallic TMN layers may also be used, including $TaN_x$, $NbN_x$, $WN_x$, or $MoN_x$ or any TMN ternary compound that have hexagonal crystalline phases with lattice constants close to that of hexagonal SiC or hexagonal III-N semiconductors. The cubic phase of some TMN materials, such as cubic NbN, have a similar interatomic spacing on the crystallographic (111) plane compared to the in-plane lattice constant of the hexagonal materials listed above (SiC and III-N semiconductors), allowing for epitaxial growth to occur. Alloys of TMNs with the III-N materials GaN, AlN, and InN, e.g., the alloys $Ti_xInN$, $Nb_xInN$, $Ta_xInN$, and $Hf_xAlN$, may provide a better lattice match with GaN and AlN and so may be of particular interest in some cases.

In addition, metallic TMN layers having cubic symmetry can be nearly lattice matched to 3C—SiC and cubic III-N semiconductors. For example, the cubic $\delta$-$NbN_x$ phase (Fm3m space group, a=0.43811) and the cubic ε'-$TaN_x$ phase (Fm3m space group, a=0.435 nm) are closely lattice-matched to 3C—SiC and GaN, and so the methodology described herein with respect to hexagonal TMNs, SiC, and III-Ns can be readily extended to cubic phases of the TMNs, SiC and III-N materials. Most TMNs also have a lower oxidation temperature compared to SiC or III-N materials.

In addition, the device structure design is not limited to structures having an epitaxial TMN layer grown on a substrate with one or more semiconductor layer(s) grown on the upper surface of the TMN layer. In other embodiments, the TMN layer(s) and semiconductor layer(s) can be grown in any way that is required or advantageous for the specific device design.

Figure 9:
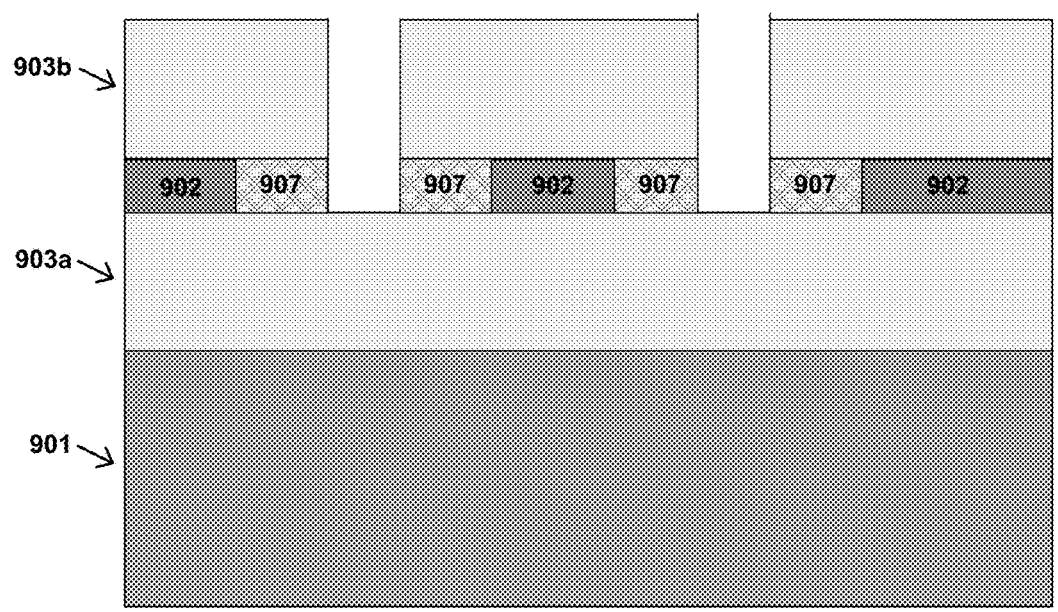
FIG. 9 is a cross-sectional block schematic of a device structure having a TMN layer with oxidized regions between two semiconductor layers in accordance with one or more aspects of the present disclosure.

For example, this may include structures in which a TMN layer 902 is situated between two semiconductor-containing layers 903a and 903b, as in the cross-sectional block schematic shown in FIG. 9.

Figure 10:
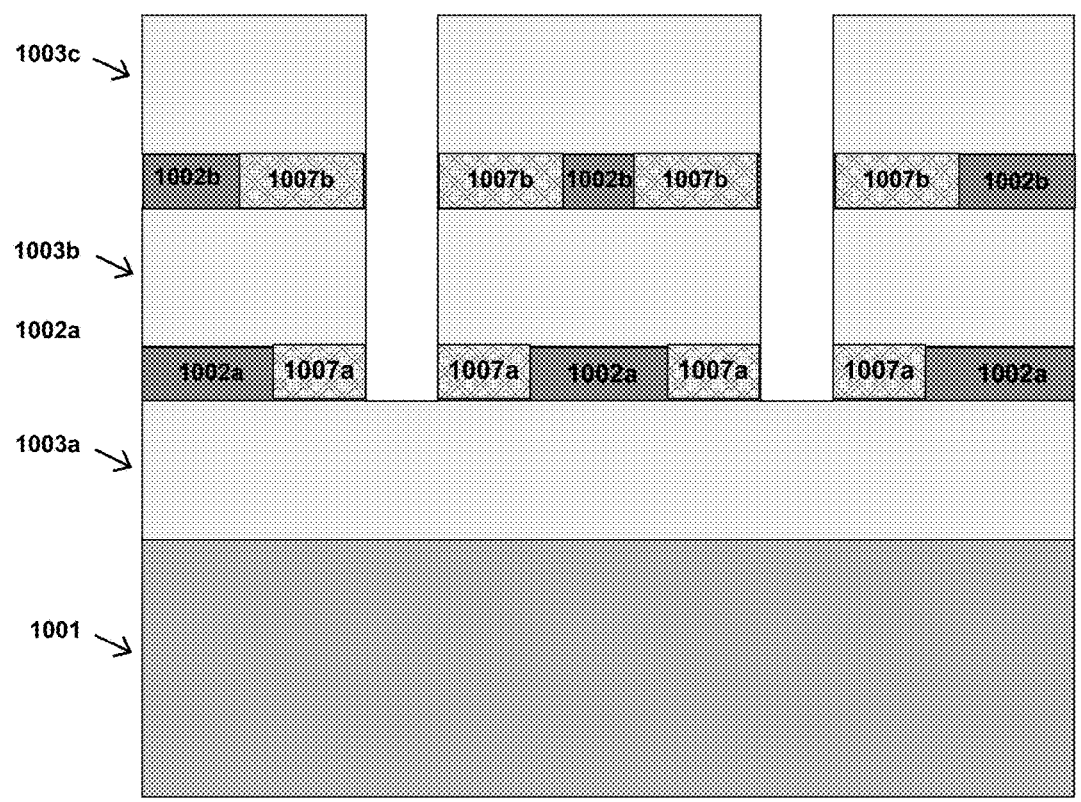
FIG. 10 is a cross-sectional block schematic of a device structure having multiple TMN layers with oxidized regions between corresponding semiconductor layers in accordance with one or more aspects of the present disclosure.

Alternatively, as shown in FIG. 10, the device structure may have multiple TMN layers 1002a/1002b and multiple semiconductor layers 1003a/103b/1003c. In such a structure, TMN layers 1002a and 1002b can be the same or can be different, such as a structure in which TMN layer 1002a is $Nb_2N$ and TMN layer 1002b is $Ta_2N$, where the oxidation rates or oxide properties may be different for each TMN layer. In some such cases, openings in the structure may be etched to semiconductor layer(s) 1003b so that only the uppermost TMN layer 1002b is exposed and selectively oxidized while the lower TMN layer 1002a remains non-oxidized and fully conductive. In other cases, the openings may be etched to semiconductor layer(s) 1003a, exposing both TMN layers 1002b and 1002a for lateral oxidation to produce areas of TMO material 1007b and 1007a, whereby the spatial profile of the TMO material in the TMN layers may be the same or may be different depending on the oxidation rate of the TMN material used in layers 1002b and 1002a. There are many other possible scenarios using standard semiconductor processing techniques that could be applied to the above structure to take advantage of multiple buried TMN layers with advantageous material properties.

An alternative embodiment of a method for forming a semiconductor device having an oxidized TMN layer incorporated therein is illustrated in the cross-sectional block schematics shown in FIGS. 11A-11D.

Figure 11A:
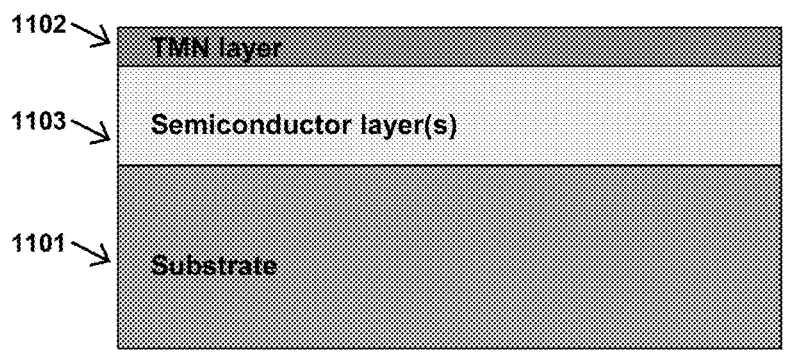
FIGS. 11A-11D are cross-sectional block schematics illustrating aspects of another exemplary method for fabricating a device having an oxidized TMN material in accordance with the one or more aspects of the present disclosure.
Figure 11B:
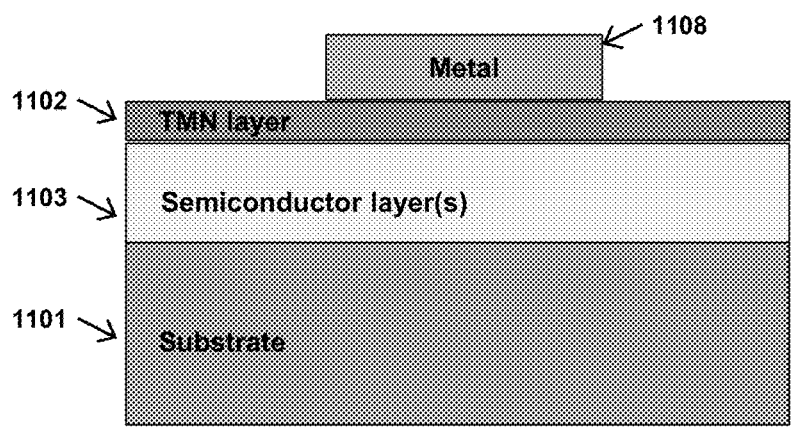
Figure 11C:
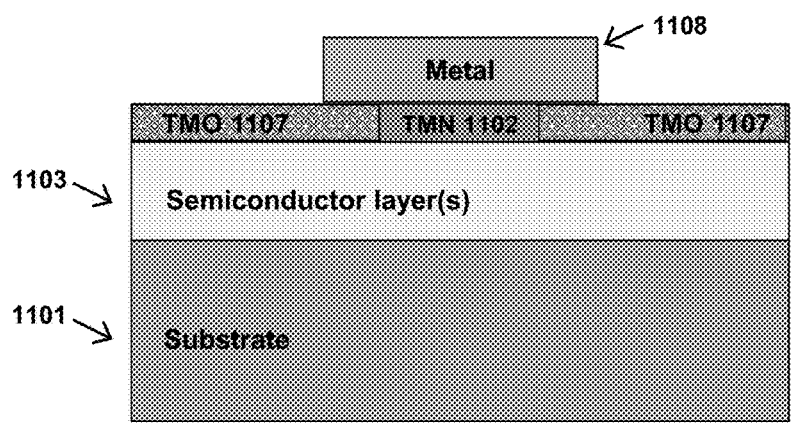
Figure 11D:
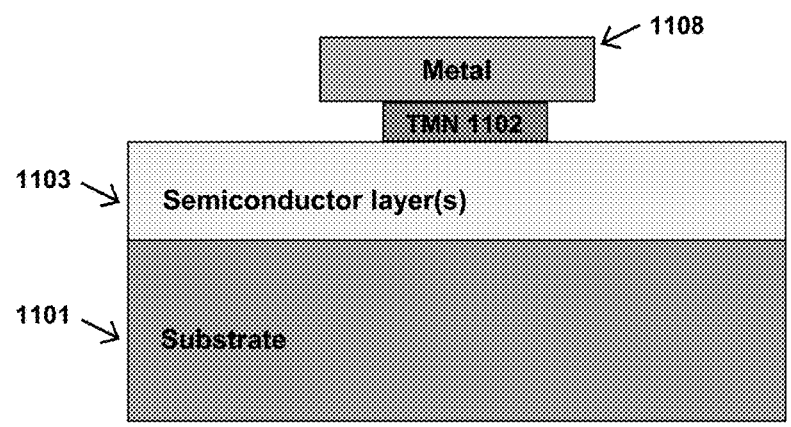

This alternative method, which may be referred to as a "gate-shrink" method, can be realized by depositing a TMN layer 1102 on a semiconductor transistor device structure 1103 as shown in FIG. 11A. In this embodiment, TMN layer 1102 need not be grown epitaxially to the underlying semiconductor layer 1103 but can be deposited using any suitable method such as sputtering, evaporation, ALD, etc. A patterned metal oxidation mask 1108 can then be deposited on top of TMN layer 1102; this metal oxidation mask can also act as the top part of the final gate structure as shown in FIG. 11D. As shown in FIG. 11C, selective oxidation of the TMN layer 1102 in accordance with the present invention can then be achieved by exposing the unmasked areas of TMN layer 1102 to $O_2$ at a controlled temperature for a controlled period of time, creating electrically insulating TMO 1107 in areas not covered by oxidation mask 1108 where the oxidation temperature and oxidation time are configured to create a desired spatial profile of TMO material 1107 within TMN layer 1102 such that TMO material 1107 extends laterally under oxidation mask 1109 and stops so as to leave a desired lateral length of conductive TMN material 1102 so that the metal mask 1108 and remaining TMN material 1102 form a "T-shaped" gate structure that is commonly used in RF transistors. By knowing the oxidation rate of TMN material layer 1102 and the lateral length of metal mask 1108, the length of the gate structure so produced can be precisely controlled, and very short gate lengths can be produced using conventional optical lithography methods. The TMO material 1107 can then be selectively removed, if needed, by conventional methods such as wet chemical etching, leaving the gate structure shown in FIG. 11D. Alternately, the TMO material may be left in place or selectively removed to engineer the mechanical strain on the underlying semiconductor to improve the electrical or optical characteristics of the semiconductor.

Advantages and New Features

The present invention allows for the selective oxidation of an electrically conductive layer within a SiC or III-N device structure wherein the oxidized portion of the electrically conductive layer can serve as an insulator in the device. The epitaxial TMN layers integrated within the semiconductor device can be oxidized thermally at practical rates and low temperatures compared to GaN. See Wolter 2000, supra, and Wolter 1998, supra. Previously reported selective oxidation of III-N layers use low temperatures, but require additional processing steps such as metal electrode deposition and etching and the use of aqueous solutions that may not be compatible with other materials. See U.S. Pat. No. 6,190,508, supra; Dorsaz, supra; and Lin, supra. The method described here requires no additional processing steps and utilizes conventional thermal oxidation methods for oxidizing the TMN. Furthermore, the high thermodynamic stability of TMN materials with III-N semiconductors allows for them to tolerate a high thermal budget prior to oxidation, providing a high level of flexibility to the device processing engineer.

Another advantage of this method is that the oxidized TMN layer typically produces an extremely high permittivity dielectric material; the oxides of Ta and Nb ($Ta_2O_5$ and $Nb_2O_5$) have reported dielectric constants of 40 and 60, respectively. See G. Pourtois, S. Clima, K. Sankaran, P. Delugas, V. Fiorentini, W. Magnus, B. Sorée, S. Van Elshocht, C. Adelman, J. Van Houdt, D. Wouters, S. De Gendt, M. M. Heyns, and J. A. Kittl, "Modeling of alternative high-k dielectrics for memory based applications," *ECS Transactions* 25 (6), 131-145 (2009). This is much higher than group III metal oxides such as $Ga_2O_3$ and $Al_2O_3$, which typically have dielectric constants of 9-10.

Device structures such as multilayer capacitors, see S. C. Hamm, L. Currano, and S. Gangopadhyay, "Multilayer thin film capacitors by selective etching of Pt and Ru electrodes," *Microelectronics Engineering* 133, 92-97 (2015), made using this method could have substantial performance improvements over other material systems and fabrication techniques.

In some embodiments, a TMO layer in a semiconductor device structure formed in accordance with the present invention can provide an energetic barrier to prevent current flow or improve the electrostatic modulation capability of an overlying device.

In some embodiments, a TMO layer in a semiconductor device structure formed in accordance with the present invention can be used as a sacrificial layer to facilitate epitaxial liftoff of overlying device layers in a selective dry or wet etch chemistry.

In some embodiments, a TMO layer in a semiconductor device structure formed in accordance with the present invention can be used as one layer in an oxide-oxide wafer bonding process.

In some embodiments, a TMO layer in a semiconductor device structure formed in accordance with the present invention can be used to introduce strain in overlying or adjacent layers.

Transistors fabricated with high dielectric constant oxide insulators also show increased performance by increasing the transistor gain for a given insulator thickness which translates to better performance for highly scaled digital logic circuits where III-V channels are being developed today.

This advantage also extends to the RF domain where gain can be improved for high frequencies while limiting parasitic leakage currents. Additionally, the buried insulator layer may improve the carrier confinement and prevent parasitic device effects such as substrate leakage.

A final advantage of this method leverages the extreme planarity of an oxide film deposited epitaxially on a semiconductor. Oxide-oxide bonds are widely used to create chip stacks of separately processed semiconductor die to realize integrated and heterogeneously integrated semiconductor device solutions. See U.S. Pat. No. 6,902,987 to Q.-Y. Tong, G. G. Fountain, Jr., and P. M. Enquist, entitled "Method for low temperature bonding and bonded structure;" see also D. S. Green, C. L. Dohrman, J. Demmin, Y. Zheng, and T. H. Chang, "A Revolution on the Horizon from DARPA: Heterogeneous Integration for Revolutionary Microwave/Millimeter-Wave Circuits at DARPA: Progress and Future Directions," *IEEE Microwave Magazine*, vol. 18, no. 2, pp. 44-59 (2017). However, getting adequate planarity from oxides deposited in conventional chemical vapor deposition techniques is challenging and requires time consuming chemical mechanical polishing. This method offers a way to realize planar oxide films while eliminating these processing steps enabling the integration of multiple semiconductor die into a single device or circuit.

Although particular embodiments, aspects, and features have been described and illustrated, it should be noted that the invention described herein is not limited to only those embodiments, aspects, and features, and it should be readily appreciated that modifications may be made by persons skilled in the art. The present application contemplates any and all modifications within the spirit and scope of the underlying invention described and claimed herein, and all such embodiments are within the scope and spirit of the present disclosure.

What is claimed is:

1. A method for making a semiconductor device having an electrically insulating oxidized layer integrated therein, comprising:
    providing a device structure comprising a substrate, a transition metal nitride (TMN) layer on an upper surface of the substrate, and a semiconductor material layer on an upper surface of the TMN material layer;
    depositing a patterned etch mask on an upper surface of the semiconductor material layer;
    etching the semiconductor material layer and the TMN material layer to expose a predetermined area of the TMN material layer;
    controllably exposing the predetermined area of the TMN material layer to oxygen at a predetermined temperature and for a predetermined period of time to oxidize the exposed TMN material, form areas of electrically insulating transition metal oxide (TMO) material within the exposed TMN material, the TMO material being separate and distinct from the semiconductor material layer;
    wherein the formed TMO material extends a first predetermined distance laterally into the TMN material so as to extend a second predetermined distance under the separate and distinct semiconductor material layer.

2. The method according to claim 1, wherein the TMN material layer is epitaxially grown on the substrate to form an epitaxial TMN material layer.

3. The method according to claim 1, wherein the TMN material layer comprises tantalum nitride ($TaN_x$), niobium nitride ($NbN_x$), tungsten nitride ($WN_x$), or molybdenum nitride ($MoN_x$).

4. The method according to claim 1, wherein the TMN material layer comprises $Ti_xInN$, $Nb_xInN$, $Ta_xInN$, or $Hf_x$-AlN.

5. The method according to claim 1, wherein the semiconductor material layer comprises a single-crystal Group III-Nitride material layer or a single-crystal SiC layer.

6. The method according to claim 1, wherein the semiconductor material layer comprises a semiconductor heterostructure including at least one Group III-Nitride material layer or a SiC layer.

7. The method according to claim 1, wherein the device structure further comprises a semiconductor material layer disposed between the substrate and the TMN material layer.

8. A method for making a semiconductor device having an electrically insulating oxidized layer integrated therein, comprising:
    providing a substrate;
    forming a semiconductor material layer on the substrate;
    forming a transition metal nitride (TMN) material layer on an upper surface of the semiconductor material layer; and
    controllably exposing the TMN material layer to oxygen at a predetermined temperature and for a predetermined period of time to oxidize the TMN material so as to form electrically insulating transition metal oxide (TMO) material within the TMN material, the TMO material being separate and distinct from the semiconductor material layer;
    wherein the formed TMO material extends a first predetermined distance laterally into the TMN material.

9. The method according to claim 8, further comprising depositing a patterned mask on an upper surface of the TMN material layer, the patterned mask exposing at least one predetermined area of the TMN material layer to be oxidized; and
    controllably exposing the predetermined area of the TMN material layer to oxygen at a predetermined temperature and for a predetermined period of time to oxidize the exposed area of the TMN material, so as to form areas of electrically insulating transition metal oxide (TMO) material within the exposed TMN material;
    wherein the formed TMO material extends a first predetermined distance laterally into the TMN material so as to extend a second predetermined distance under the mask.

10. The method according to claim 8, further comprising depositing a patterned metal mask on an upper surface of the TMN layer, the patterned mask exposing at least one predetermined area of the TMN material layer to be oxidized;
    controllably exposing the predetermined area of the TMN material layer to oxygen at a predetermined temperature and for a predetermined period of time to oxidize the exposed area of the TMN material, form areas of electrically insulating transition metal oxide (TMO) material from the exposed TMN material;
    wherein the formed TMO material extends a first predetermined distance laterally into the TMN material so as to extend a second predetermined distance under the area of the TMN material layer covered by the mask.

11. The method according to claim 8, wherein the TMN material layer comprises tantalum nitride ($TaN_x$), niobium nitride ($NbN_x$), tungsten nitride ($WN_x$), or molybdenum nitride ($MoN_x$).

12. The method according to claim 8, wherein the TMN material layer comprises $Ti_xInN$, $Nb_xInN$, $Ta_xInN$, or $Hf_x$-AlN.

13. The method according to claim 8, wherein the semiconductor material layer comprises a single-crystal Group III-Nitride material layer or a single-crystal SiC layer.

14. The method according to claim 8, wherein the semiconductor material layer comprises a semiconductor heterostructure including at least one Group III-Nitride material layer or a SiC layer.

15. A method for making a semiconductor device having an electrically insulating oxidized layer integrated therein, comprising:
   forming a first semiconductor material layer on the substrate;
   forming first transition metal nitride (TMN) material layer on an upper surface of the semiconductor material layer;
   forming a second semiconductor material layer on the first TMN material layer;
   forming second transition metal nitride (TMN) material layer on an upper surface of the second semiconductor material layer;
   forming a third semiconductor material layer on the second TMN material layer;
   depositing a patterned etch mask on an upper surface of the semiconductor material layer;
   etching the third semiconductor material layer and the second TMN material layer to expose a predetermined area of the second TMN material layer; and
   controllably exposing the predetermined area of the second TMN material layer to oxygen at a predetermined temperature and for a predetermined period of time to oxidize the predetermined area of the second TMN material layer, form first areas of electrically insulating first transition metal oxide (TMO) material from the exposed second TMN material, and produce
   a predetermined spatial profile of first TMO material within the second TMN material layer.

16. The method according to claim 15, further comprising etching the second semiconductor material layer and the first TMN material layer to further expose a predetermined area of the first TMN material layer; and
   controllably exposing the predetermined areas of the second and first TMN material layers to oxygen at a predetermined temperature and for a predetermined period of time to oxidize the predetermined areas of the second and first TMN material layers, form areas of electrically insulating first transition metal oxide (TMO) material from the exposed second TMN material and areas of electrically insulating second transition metal oxide (TMO) material from the exposed first TMN material, and produce
   a predetermined spatial profile of first TMO material within the second TMN material layer and a predetermined spatial profile of second TMO material within the first TMN material layer.

17. The method according to claim 15, wherein the first and second TMN material layers are the same.

18. The method according to claim 15, wherein the first and second TMN material layers are different.

19. The method according to claim 15, wherein at least one of the first and second TMN material layers comprise tantalum nitride ($TaN_x$), niobium nitride ($NbN_x$), tungsten nitride ($WN_x$), or molybdenum nitride ($MoN_x$).

20. The method according to claim 15, wherein at least one of the first and second TMN material layer comprises $Ti_xInN$, $Nb_xInN$, $Ta_xInN$, and $Hf_xAlN$.

21. The method according to claim 15, wherein at least one of the first, second, and third semiconductor material layers comprises a single-crystal Group III-Nitride material layer or a single-crystal SiC layer.

22. The method according to claim 15, wherein at least one of the first, second, and third semiconductor material layers comprises a semiconductor heterostructure including at least one Group III-Nitride material layer or SiC layer.

* * * * *